United States Patent
He et al.

(10) Patent No.: US 10,408,882 B2
(45) Date of Patent: Sep. 10, 2019

(54) METHOD FOR PREDICTING REMAINING USEFUL LIFE OF LITHIUM BATTERY BASED ON WAVELET DENOISING AND RELEVANCE VECTOR MACHINE

(71) Applicant: HEFEI UNIVERSITY OF TECHNOLOGY, Hefei, Anhui (CN)

(72) Inventors: Yigang He, Anhui (CN); Chaolong Zhang, Anhui (CN); Lei Zuo, Anhui (CN); Sheng Xiang, Anhui (CN); Baiqiang Yin, Anhui (CN)

(73) Assignee: HEFEI UNIVERSITY OF TECHNOLOGY, Hefei, Anhui (CN)

( * ) Notice: Subject to any disclaimer, the term of this patent is extended or adjusted under 35 U.S.C. 154(b) by 229 days.

(21) Appl. No.: 15/324,806

(22) PCT Filed: Oct. 20, 2015

(86) PCT No.: PCT/CN2015/092241
§ 371 (c)(1),
(2) Date: Jan. 9, 2017

(87) PCT Pub. No.: WO2016/107246
PCT Pub. Date: Jul. 7, 2016

(65) Prior Publication Data
US 2017/0205466 A1    Jul. 20, 2017

(30) Foreign Application Priority Data
Dec. 29, 2014    (CN) .......................... 2014 1 0833574

(51) Int. Cl.
*G01R 31/367* (2019.01)
*G06F 17/16* (2006.01)
(Continued)

(52) U.S. Cl.
CPC ........... *G01R 31/367* (2019.01); *G06F 17/16* (2013.01); *G06N 3/126* (2013.01); *G06N 5/04* (2013.01); *G06N 7/005* (2013.01); *G01R 31/392* (2019.01)

(58) Field of Classification Search
CPC . G01R 31/3651; G01R 31/3679; G06F 17/16; G06N 5/04
(Continued)

(56) References Cited

U.S. PATENT DOCUMENTS

| 2011/0128006 A1* | 6/2011 | Ren ..................... G01R 31/3679 324/426 |
| 2011/0167025 A1* | 7/2011 | Danai .................... G05B 17/02 706/12 |
| 2017/0003352 A1* | 1/2017 | Barre .................. B60L 11/1861 |

OTHER PUBLICATIONS

Tipping, "Sparse Bayesian Learning and the Relevance Vector Machine", Journal of Machine Learning Research 1 (2001) 211-244.*

(Continued)

*Primary Examiner* — Stephanie E Bloss

(57) ABSTRACT

A method for predicting a remaining useful life of a lithium battery based on a wavelet denoising and a relevance vector machine, relating to a method for estimating health condition and predicting remaining useful life of lithium battery, includes steps of: (1) obtaining health condition data of each of charge-discharge cycles of the lithium battery by measurement; (2) processing capacity data measured of the lithium battery with wavelet double denoising; (3) calculating a capacity threshold where the lithium battery fails; (4) referring to capacity data and charge-discharge cycle data of the lithium battery, applying a differential evolution algorithm for optimizing a width factor of the relevance vector machine; and (5) predicting the remaining useful life of the lithium battery with the relevance vector machine optimized (Continued)

by the differential evolution algorithm. The method is simple and effective, which can accurately predict remaining useful life of lithium battery.

5 Claims, 4 Drawing Sheets

(51) Int. Cl.
    *G06N 5/04*         (2006.01)
    *G06N 3/12*         (2006.01)
    *G06N 7/00*         (2006.01)
    *G01R 31/392*     (2019.01)

(58) Field of Classification Search
    USPC .......................................................... 706/45
    See application file for complete search history.

(56) References Cited

OTHER PUBLICATIONS

Li et al, "Intelligent Prognostics for Battery Health Monitoring Using the Mean Entropy and Relevance Vector Machine", IEEE Transactions on Systems, Man, and Cybernetics: Systems, vol. 44, No. 7, Jul. 2014.*

Saha et al, "Prognostics Methods for Battery Health Monitoring Using a Bayesian Framework", IEEE Transactions on Instrumentation and Measurement, vol. 58, No. 2, Feb. 2009.*

* cited by examiner

METHOD FOR PREDICTING REMAINING USEFUL LIFE OF LITHIUM BATTERY BASED ON WAVELET DENOISING AND RELEVANCE VECTOR MACHINE

CROSS REFERENCE OF RELATED APPLICATION

This is a U.S. National Stage under 35 U.S.C 371 of the International Application PCT/CN2015/092241, filed Oct. 20, 2015, which claims priority under 35 U.S.C. 119(a-d) to CN 201410833574.7, filed Dec. 29, 2014.

BACKGROUND OF THE PRESENT INVENTION

Field of Invention

The present invention relates to a method for predicting a remaining useful life of a lithium battery based on a wavelet denoising and a relevance vector machine, and more particularly to a method which extracts raw data through a wavelet double denoising, and establishes a prediction model with a relevance vector machine based on the raw data extracted, for predicting a remaining useful life of a lithium battery.

Description of Related Arts

Lithium batteries are widely used in portable electronic devices, electric vehicles, military electronic systems, etc. Failure of the lithium batteries will cause device performance degradation, malfunction, slow response and other electronic failures. Therefore, it is very necessary to predict the remaining useful life of lithium batteries.

Generally, health of the lithium battery is indicated by capacity, and capacity data are obtained by measurement in continual charge-discharge cycles. During measurement, due to unavoidable presence of electromagnetic interference, measurement error, random load, and unpredictable physical or chemical behavior inside the lithium battery, lithium battery capacity measurement data obtained generally comprises various types of noise with different strengths, rendering it impossible to accurately predict the battery life.

Wavelet denoising is a newly-developed method for extracting the raw data. With wavelet decomposition and reconstruction, the raw data can be extracted while noise is eliminated or reduced. However, since the noise of the lithium battery capacity data has many types and different sizes, it is difficult to sufficiently remove the noise with the basic wavelet denoising algorithm. Relevance vector machine is a regression prediction algorithm based on Bayesian framework, which has a high computing speed, and is suitable for online testing. It has been proved that the prediction accuracy of the relevance vector machine is higher than commonly used algorithms such as support vector machine algorithm and neural networks. For relevance vector machine algorithm, width factor of kernel function has a great impact on the prediction accuracy, which is obtained by past experience, causing a low prediction accuracy of the remaining useful life of the lithium battery.

SUMMARY OF THE PRESENT INVENTION

An object of the present invention is to overcome the above technical defects and provide a method for predicting a remaining useful life of a lithium battery based on a wavelet denoising and a relevance vector machine, wherein the advanced method effectively eliminates noise and extracts raw data, as well as accurately predicts the remaining useful life of the lithium battery.

The method firstly uses a wavelet double denoising for processing capacity data of the lithium battery, so as to eliminate noise and extract effective raw data; and then predicts the remaining useful life of the lithium battery, namely remaining charge-discharge cycles, with the relevance vector machine whose width factor is optimized based on a differential evolution algorithm.

Accordingly, in order to accomplish the above objects, the present invention provides:

a method for predicting a remaining useful life of a lithium battery based on a wavelet denoising and a relevance vector machine, comprising steps of:

(1) obtaining health condition data of each of charge-discharge cycles of the lithium battery by measurement;

(2) processing capacity data measured of the lithium battery with wavelet double denoising;

(3) calculating a capacity threshold where the lithium battery fails;

(4) referring to capacity data and charge-discharge cycle data of the lithium battery, applying a differential evolution algorithm for optimizing a width factor of the relevance vector machine; and (5) predicting the remaining useful life of the lithium battery with the relevance vector machine optimized by the differential evolution algorithm.

In the step (1), the health condition data of the lithium battery is the capacity data of the lithium battery.

In the step (2), the wavelet double denoising is used for processing the capacity data measured of the lithium battery with the wavelet denoising for twice, so as to eliminate noise signals.

In the step (3), the capacity threshold where the lithium battery fails is 65%-75% of a nominal capacity of the lithium battery.

In the step (4), the capacity data of the lithium battery are $H_1, H_2, \ldots, H_n$, where $n \geq 1$, and n is a cycle number measured; the capacity data series of the lithium battery is $[H_1, H_2, \ldots, H_n]$; the charge-discharge cycles of the capacity data of the lithium battery are $T_1, T_2, \ldots, T_n$, and the charge-discharge cycle data series is $[T_1, T_2, \ldots, T_n]$;

applying the differential evolution algorithm for optimizing the width factor of the relevance vector machine specifically comprises steps of:

(4.1) initialing the differential evolution algorithm, comprising population vectors and sizes, a scale factor, a cross constant and iterations, and the width factor to be optimized is mapped to a vector;

(4.2) generating a mutant vector by a mutation operation;

(4.3) generating a test vector by a cross operation;

(4.4) selecting a next generation vector by a selection operation; and (4.5) repeating the steps (4.1)-(4.4) until iteration ending, and outputting results.

The differential evolution algorithm is a random search algorithm based on the population vectors, which randomly generates vectors $X_{i,G}$ (i=1, 2, ..., N), where i is a vector identifier, N is the vector amount, and G is the iteration number; and the differential evolution algorithm comprises the mutation operation, the cross operation and the selection operation;

the mutant vector is generated during the mutation operation through a following equation:

$$V_{i,G} = X_{r1,G} + F(X_{r2,G} - X_{r3,G}),\ r1 \neq r2 \neq r3 \neq i;$$

where r1, r2 and r3 are randomly selected from {1, 2, ..., N}; F is the scale factor;

the test vector is generated during the cross operation through $V_{i,G}$ and $X_{i,G}$:

$$U_{i,G} = \begin{cases} V_{i,G}, & \text{rand} \leq G \\ X_{i,G}, & \text{otherwise} \end{cases};$$

where the cross constant $C \in [0,1]$ is pre-determined, and rand is a random number ranged from 0-1;

assuming $f(x)$ is a fitness function to be minimized, the next generation vector is generated by the selection operation:

$$X_{i,G+1} = \begin{cases} U_{i,G}, & \text{if } f(U_{i,G}) < f(X_{i,G}) \\ X_{i,G}, & \text{otherwise} \end{cases}.$$

In the step (5), the remaining useful life is remaining charge-discharge cycles before the lithium battery fails;

predicting the remaining useful life of the lithium battery with the relevance vector machine optimized by the differential evolution algorithm specifically comprises steps of: continually predicting a capacity of the lithium battery of each of the charge-discharge cycles after $T_n$, finding out a first charge-discharge cycle $T_{n+g}$ satisfying $H_{n+g} \geq H_{threshold}$ and $H_{n+g+1} < H_{threshold}$, where the lithium battery fails after the first charge-discharge cycle $T_{n+g}$, and the remaining useful life is g charge-discharge cycles; where $H_{threshold}$ is the capacity threshold where the lithium battery fails.

Compared with conventional technologies, the present invention has advantages as follows:

(1) the present firstly discloses the wavelet double denoising method, and applies to process the lithium treatment data measured, where processed data are closer to raw data;

(2) after the width factor is optimized by the differential evolution algorithm, prediction accuracy of the relevance vector machine algorithm is significantly improved when being compared to conventional experience methods; according to the present invention, in experimental examples of predicting the remaining useful life of the lithium battery, the prediction accuracy is increased by at least 4.1%.

DETAILED DESCRIPTION OF THE PREFERRED EMBODIMENT

Referring to drawings and a preferred embodiment, the present invention is further illustrated.

Figure 1:
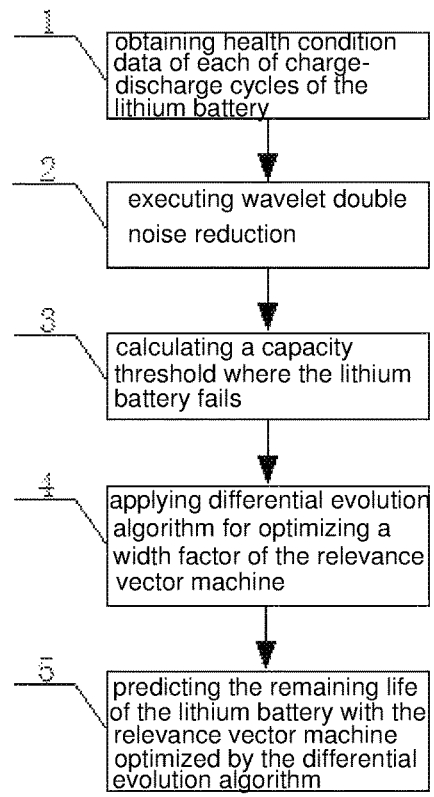
FIG. 1 is a flow chart of a method for predicting a remaining useful life of a lithium battery based on a wavelet denoising and a relevance vector machine

Referring to FIG. 1, a flow chart of the present invention comprises five steps of:

step 1: obtaining health condition data of each of charge-discharge cycles of the lithium battery by measurement;

step 2: processing capacity data measured of the lithium battery with wavelet double denoising;

step 3: calculating a capacity threshold where the lithium battery fails;

step 4: referring to capacity data and charge-discharge cycle data of the lithium battery, applying a differential evolution algorithm for optimizing a width factor of the relevance vector machine; and step 5: predicting the remaining useful life of the lithium battery with the relevance vector machine optimized by the differential evolution algorithm.

In the step 1, the health condition data of the lithium battery is the capacity data of the lithium battery.

Obtaining capacity changing data of each of the charge-discharge cycles of the lithium battery by measurement is described as follows. During detecting the battery capacity data, the lithium battery work under two states: a charging state and a discharging state. A constant current is firstly applied for charging the lithium battery. When a charging voltage reaches a rate voltage, the voltage is maintained until the current is lowered to a pre-determined value, so as to finish one charging process. For discharging, a working current is maintained until the voltage is lowered to a pre-determined value, so as to finish one discharging process. A complete charge-discharge process forms a cycle, and the battery capacity of each charge-discharge cycle is detected, namely measurement data. Generally, the more the charge-discharge cycles are used, the lower the capacity of the lithium battery will be.

In the step 2, the wavelet double denoising is described as follows.

Assuming the capacity data extracted of the lithium battery is $H_1, H_2, \ldots, H_n$, where $n \geq 1$, and n is a cycle number measured, namely a date size. H(x) represents the data extracted, where x is data identifier and $x \in [1,n]$. H(x) is firstly processed with wavelet decomposition. Assuming that $\{V_k\}_{k \in Z}$ is an orthogonal multiresolution analysis and $\{W_k\}_{k \in Z}$ is a corresponding wavelet space, H(x) on the $V_k$ may be decomposed to $$\sum_{i \in Z} c_{k+1}^i \phi_{k+1,i} + \sum_{i \in Z} d_{k+1}^i \psi_{k+1,i}$$

where k and i are discretization parameters, Z represent real numbers, $\Phi_{k+1,i}$ and $\psi_{k+1,i}$ are respectively scale function and wavelet function under a $2^{k+1}$ resolution, $c_{k+1}^i$ and $d_{k+1}^i$ are respectively approximation coefficient and detail coefficient of H(x) under a $2^{k+1}$ resolution. In the wavelet denoising, if the value of a certain coefficient is lower than the wavelet threshold, then the coefficient is composed of noise. As a result, the coefficient is set to 0, and the rest coefficient is reconstructed, so as to generate noise-reduced raw data. According to the present invention, the wavelet double denoising processes the measured data with denoising for twice, and a first denoising adapts a wavelet threshold generated by a Sqtwolog method, whose equation is:

$$Threshold_{sqtwolog} = \sqrt{2\log n};$$

where n≥1, and n is the cycle number measured, namely the date size.

and a second denoising adapts a wavelet threshold generated by a Minimax method, whose equation is:

$$Threshold_{minimax} = 0.3936 + 0.1829 * \frac{\log(n)}{\log(2)};$$

The wavelet threshold of the Sqtwolog method is much higher than that of the Minimax method, and the first denoising is able to eliminate large noise in the date measured, while the second denoising is able to eliminate small noise in the date measured. The wavelet double denoising is able to effectively eliminate or reduce the noise in the capacity data measured of the lithium battery.

In the step 3, the capacity threshold where the lithium battery fails is 65%-75% of a nominal capacity of the lithium battery.

In the step 4, the capacity data of the lithium battery are $H_1, H_2, \ldots, H_n$, where n≥1, and n is a cycle number measured; the capacity data series of the lithium battery is $[H_1, H_2, \ldots, H_n]$; the charge-discharge cycles of the capacity data of the lithium battery are $T_1, T_2, \ldots, T_n$, and the charge-discharge cycle data series is $[T_1, T_2, \ldots, T_n]$.

applying the differential evolution algorithm for optimizing the width factor of the relevance vector machine specifically comprises steps of:

(4.1) initialing the differential evolution algorithm, comprising population vectors and amount, a scale factor, a cross constant and iterations, and the width factor to be optimized is mapped to a vector;

(4.2) generating a mutant vector by a mutation operation;

(4.3) generating a test vector by a cross operation;

(4.4) selecting a next generation vector by a selection operation; and (4.5) repeating the steps (4.1)-(4.4) until iteration ending, and outputting results.

The differential evolution algorithm is a random search algorithm based on the population vectors, which randomly generates vectors $X_{i,G}$ (i=1, 2, . . . , N), where i is a vector identifier, N is the vector amount, and G is the iteration number; and the differential evolution algorithm comprises the mutation operation, the cross operation and the selection operation.

The mutant vector is generated during the mutation operation through the following equation:

$$V_{i,G} = X_{r1,G} + F(X_{r2,G} - X_{r3,G}), r1 \neq r2 \neq r3 \neq i;$$

where r1, r2 and r3 are randomly selected from {1, 2, . . . , N}; F is the scale factor.

The test vector is generated during the cross operation through $V_{i,G}$ and $X_{i,G}$:

$$U_{i,G} = \begin{cases} V_{i,G}, & rand \leq G \\ X_{i,G}, & otherwise \end{cases};$$

where the cross constant C∈[0,1] is pre-determined, and rand is a random number ranged from 0-1.

Assuming $f(x)$ is a fitness function to be minimized, the next generation vector is generated by the selection operation:

$$X_{i,G+1} = \begin{cases} U_{i,G}, & if\ f(U_{i,G}) < f(X_{i,G}) \\ X_{i,G}, & otherwise \end{cases}.$$

According to the present invention, $f(x)$ refers to Mse, namely mean square error, between predicted data of the relevance vector machine with x as the width factor, and real data. Mse is a minimized objective function representing how close a relationship is between the predicted data and the real data. $f(U_{i,G})$ and $f(X_{i,G})$ respectively represent Mse between predicted data of the relevance vector machine with $U_{i,G}$ and $X_{i,G}$ as the width factor, and the real data. An equation of Mse is:

$$Mse = \frac{\sum_{r=1}^{S} [z^*(T) - z(T)]^2}{S};$$

where T=1, 2, . . . S, T is the data identifier, S is the training data amount; $z^*(T)$ and $z(T)$ are respectively the predicted data and the real data.

In the step 5, predicting the remaining useful life of the lithium battery with the relevance vector machine optimized by the differential evolution algorithm is described as follows.

A predicted output of the relevance vector machine is:

$$z = y(x) + \varepsilon_n;$$

where x is a sample; $\varepsilon_n$ is noise with a mean of 0 and a variance of $\sigma^2$; y(x) is an output function expressed as:

$$y(x) = \sum_{u=1}^{N} w_u K(x, x_u) + w_0;$$

where $w_u$ is the weight; $w_0$ is a deviation; $X_u$ is a No. u sample; $K(x, x_u)$ is a kernel function, and Gaussian kernel function is adapted because Gaussian kernel function always has excellent nonlinear processing ability:

$$K(x, x_u) = \exp\left(-\frac{(x - x_u)^2}{2\gamma^2}\right);$$

where γ is the width factor, which is important to prediction performance of the relevance vector machine, and is optimized by the differential evolution algorithm according to the present invention.

Predicting the remaining useful life of the lithium battery with the relevance vector machine optimized by the differential evolution algorithm specifically comprises steps of: continually predicting a capacity of the lithium battery of each of the charge-discharge cycles after $T_n$ with the relevance vector machine optimized by the differential evolution algorithm, finding out a first charge-discharge cycle $T_{n+g}$ satisfying $H_{n+g} \geq H_{threshold}$ and $H_{n++1} < H_{threshold}$, and the lithium battery fails after the first charge-discharge cycle $T_{n+g}$, and the remaining useful life is g charge-discharge cycles; where $H_{threshold}$ is the capacity threshold where the lithium battery fails.

Figure 2:
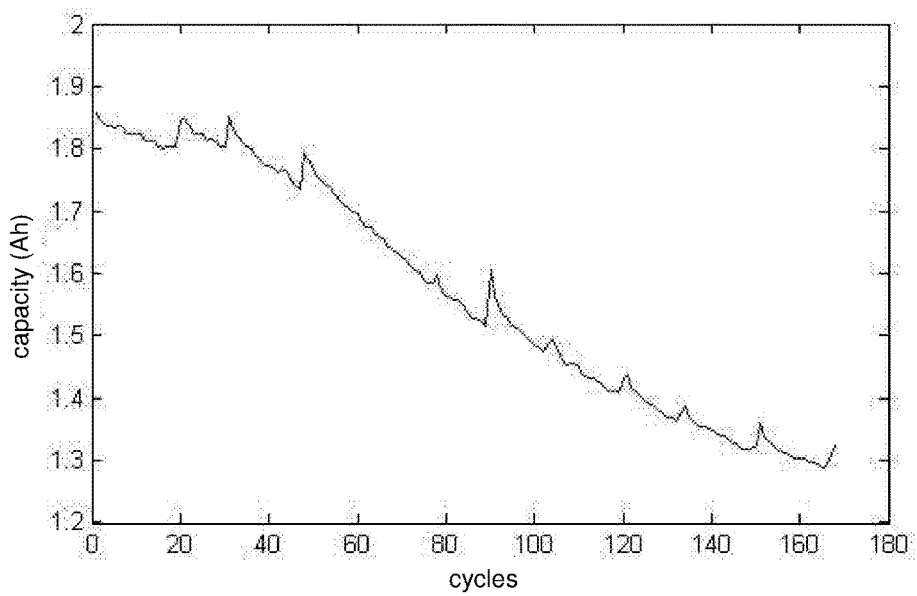
FIG. 2 illustrates a capacity of a No. 5 lithium battery changing with charge-discharge cycles.

Referring to a preferred embodiment of the present invention, processes and prediction performance of the method for predicting the remaining useful life of the lithium battery based on the wavelet denoising and the relevance vector machine are illustrated. Capacity data measured of a No. 5 lithium battery, provided by NASA Ames Research Center, are used as experimental subjects. FIG. 2 illustrates the capacity of the No. 5 lithium battery changing with the charge-discharge cycles. It can be seen from FIG. 2 that the capacity of the lithium battery decreases with increase of the charge-discharge cycle number. However, in some cycles, the capacity rapidly and transiently increases, which is generally caused by noise interference.

Figure 3:
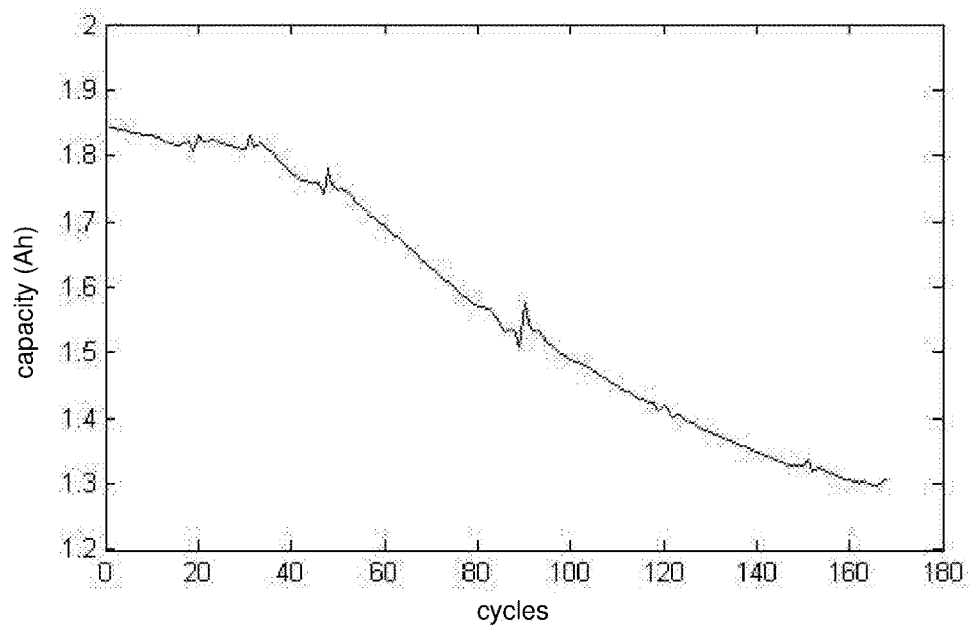
FIG. 3 illustrates capacity data of the lithium battery which are processed with the wavelet denoising using a wavelet threshold generated by a Minimax method.
Figure 4:
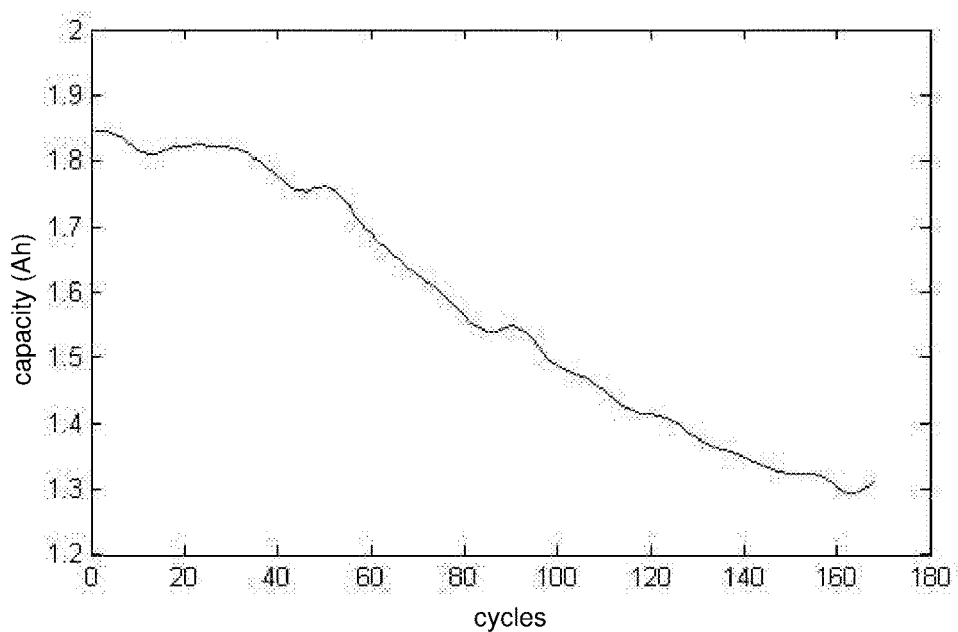
FIG. 4 illustrates the capacity data of the lithium battery which are processed with the wavelet denoising using a wavelet threshold generated by a Sqtwolog method.
Figure 5:
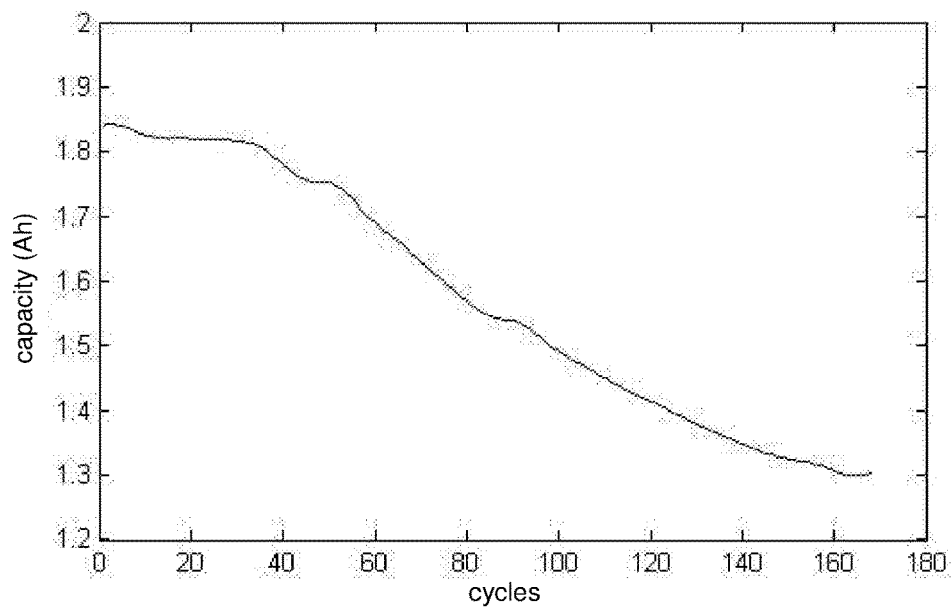
FIG. 5 illustrates the capacity data of the lithium battery which are processed with a wavelet double denoising of the present invention.

The capacity data of the No. 5 lithium battery are processed with wavelet denoising. FIG. 3 illustrates the capacity data of the lithium battery which are processed with the wavelet denoising using the wavelet threshold generated by the Minimax method, and FIG. 4 illustrates the capacity data of the lithium battery which are processed with the wavelet denoising using the wavelet threshold generated by the Sqtwolog method. FIG. 5 illustrates the capacity data of the lithium battery which are processed with the wavelet double denoising of the present invention. According to comparison, it is found that the capacity data of the lithium battery obtained by the method of the present invention continuously and smoothly decrease with increase of the charge-discharge cycle number, which is more consistent with actual capacity change of the lithium battery, namely closer to the raw data.

According to research results of NASA Ames Research Center, nominal value of the No. 5 lithium battery is 2 Ah, and 1.38 Ah is a failure threshold of the battery. The capacity data are collected from 166 charge-discharge cycles, where the first 129 charge-discharge cycles are effective cycles where the capacity is higher than 1.38 Ah, and the lithium battery fails in the rest cycles due to the capacity lower than 1.38 Ah. Data of the former 80 charge-discharge cycles are used as training data, and data of the latter 86 charge-discharge cycles are used as testing data. The remaining useful life of the lithium battery is 49 charge-discharge cycles, based on the training data, the differential evolution algorithm is used for optimizing the width factor of the relevance vector machine, and the prediction accuracy of the relevance vector machine is detected by the testing data.

Figure 6:
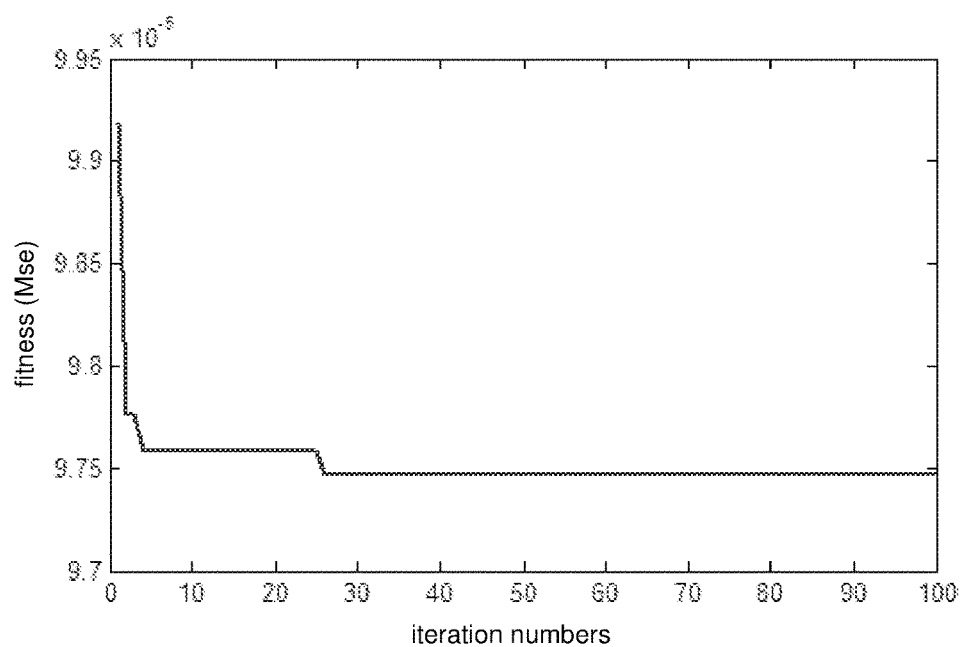
FIG. 6 illustrates a process of optimizing a width factor of a relevance vector machine algorithm by a differential evolution algorithm.
Figure 7:
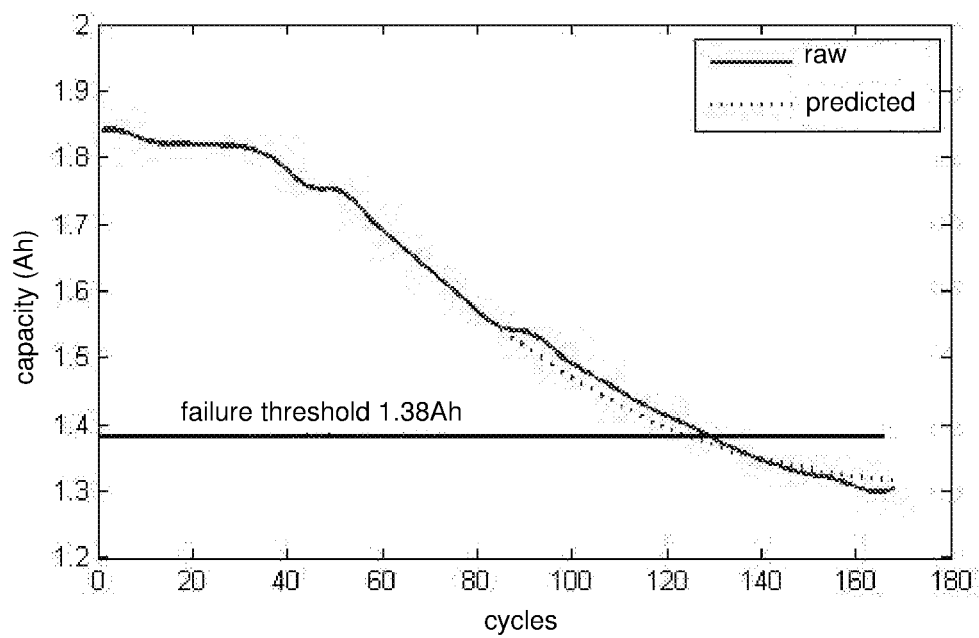
FIG. 7 illustrates prediction results of the capacity data of the lithium battery in latter 86 cycles, which are predicted by an optimized relevance vector machine.

The population amount and the iteration number of the differential evolution algorithm are set to 30 and 100, and F is equal to 0.6; C linearly decreases from 0.9 to 0.3 with iteration. FIG. 6 illustrates the process of optimizing the width factor of the relevance vector machine algorithm by the differential evolution algorithm based on the training data. An optimized width factor is 0.5011. The width factor 0.5011 is applied to the relevance vector machine for predicting capacity values of the lithium battery in the latter 86 charge-discharge cycles, and predicted capacity values are compared with real capacity values, and predictions results are shown in FIG. 7. In this prediction, the prediction results shows that there are totally 125 effective charge-discharge cycles of the lithium battery, and the remaining useful life is 45 charge-discharge cycles, where an error is −4 cycles and Mse generated by the test is 1.4331e-04. Since the optimized width factor is between 0.1-1, a width factor value is determined in such range through repeated experiments. In order to prove that optimizing the width factor with the differential evolution algorithm is better than selecting the width factor by experience, the width factor is respectively set to 0.1, 0.2, 0.3, 0.4, 0.5, 0.6, 0.7, 0.8, 0.9 and 1, for predicting the capacity values of the lithium battery in the latter 86 charge-discharge cycles, so as to calculate the remaining useful life of the lithium battery, and the prediction results are shown in Table 1.

TABLE 1 prediction results when width factor is 0.1, 0.2, 0.3, 0.4, 0.5, 0.6, 0.7, 0.8, 0.9 and 1

| width factor | predicted remaining life | error | Mse |
| --- | --- | --- | --- |
| 0.1 | 15 | −34 | 0.0079 |
| 0.2 | 24 | −24 | 0.0035 |
| 0.3 | 43 | −6 | 2.2662e-04 |
| 0.4 | 30 | −19 | 0.0020 |
| 0.5 | 43 | −6 | 1.5296e-04 |
| 0.6 | 57 | 8 | 6.5956e-04 |
| 0.7 | 27 | −22 | 0.0108 |
| 0.8 | 26 | −23 | 0.0198 |
| 0.9 | 25 | −24 | 0.0267 |
| 1 | 23 | −26 | 0.0335 |

From Table 1, it is learned that predicting the remaining useful life of the lithium battery by the relevance vector machine whose width factor is optimized by the differential evolution algorithm has best prediction accuracy and smallest prediction error of only −4 charge-discharge cycles, and Mse is also the smallest. Referring to the relevance vector machine whose width factor is set to 0.1, 0.2, 0.3, 0.4, 0.5, 0.6, 0.7, 0.8, 0.9 and 1, the prediction errors and Mses are both higher than that of the relevance vector machine algorithm of the present invention whose width factor is optimized by the differential evolution algorithm, and the prediction error of −6 of the remaining useful life predicted by the relevance vector machine is smallest when the width factor is set to 0.3 or 0.5, and the predicted remaining useful life of 43 charge-discharge cycles is closest to a standard value. The present invention provides the method for optimizing the width factor by the differential evolution algorithm, and the predicted remaining useful life is 45 charge-discharge cycles with the error of −4 cycles, indicating that the prediction accuracy is increased by at least 4.1%.

According to the preferred embodiment, it is proved that the method for predicting the remaining useful life of the lithium battery based on the wavelet denoising and the relevance vector machine of the present invention is simple while effective, which provides a relatively high prediction accuracy at the same time.

What is claimed is:

1. A method for predicting a remaining useful life of a lithium battery based on a wavelet denoising and a relevance vector machine, comprising steps of:
   (1) obtaining health condition data of each of charge-discharge cycles of the lithium battery by a measurement circuit;
   (2) processing capacity data measured of the lithium battery with wavelet double denoising on a computer;
   (3) calculating a capacity threshold where the lithium battery fails;
   (4) referring to the capacity data and the heath condition data of the lithium battery, applying a differential evolution algorithm for optimizing a width factor of the relevance vector machine; and
   (5) predicting the remaining useful life of the lithium battery with the relevance vector machine optimized by the differential evolution algorithm; and displaying the remaining useful life with the computer;

wherein in the step (4), the capacity data of the lithium battery are $H_1, H_2, \ldots, H_n$, where $n \geq 1$, and n is a cycle number measured; the capacity data series of the lithium battery is $[H_1, H_2, \ldots, H_n]$; the charge-discharge cycles of the capacity data of the lithium battery are $T_1, T_2, \ldots, T_n$, and the charge-discharge cycle data series is $[T_1, T_2, \ldots, T_n]$;

applying the differential evolution algorithm for optimizing the width factor of the relevance vector machine specifically comprises steps of:

(4.1) defining the differential evolution algorithm, comprising population vectors and sizes, a scale factor, a cross constant and iterations, and the width factor to be optimized is mapped to a vector;

(4.2) generating a mutant vector by a mutation operation;

(4.3) generating a test vector by a cross operation;

(4.4) selecting a next generation vector by a selection operation; and (4.5) repeating the steps (4.1)-(4.4) until iteration ending, and outputting results;

wherein the differential evolution algorithm is a random search algorithm based on the population vectors, which randomly generates vectors $X_{i,G}=1, 2, \ldots, N$), where i is a vector identifier, N is the vector amount, and G is the iteration number;

and the differential evolution algorithm comprises the mutation operation, the cross operation and the selection operation;

wherein in the step (4.2), the mutant vector is generated during the mutation operation through a following equation:

$$V_{i,G}=X_{r1,G}+F(X_{r2,G}-X_{r3,G}), r1 \neq r2 \neq r3 \neq i;$$

where r1, r2 and r3 are randomly selected from $\{1, 2, \ldots, N\}$; F is the scale factor;

wherein in the step (4.3), the test vector is generated during the cross operation through $V_{i,G}$ and $X_{i,G}$:

$$U_{i,G} = \begin{cases} V_{i,G}, & \text{rand} \leq G \\ X_{i,G}, & \text{otherwise} \end{cases};$$

where the cross constant $C \in [0,1]$ is pre-determined, and rand is a random number ranged from 0-1;

wherein in the step (4.4), assuming $f(x)$ is a fitness function to be minimized, the next generation vector is generated by the selection operation:

$$X_{i,G+1} = \begin{cases} U_{i,G}, & \text{if } f(U_{i,G}) < f(X_{i,G}) \\ X_{i,G}, & \text{otherwise} \end{cases}.$$

2. The method, as recited in claim 1, wherein in the step (1), the health condition data of the lithium battery is the capacity data of the lithium battery.

3. The method, as recited in claim 1, wherein in the step (2), the wavelet double denoising is used twice for processing the capacity data measured of the lithium battery, so as to eliminate noise signals.

4. The method, as recited in claim 1, wherein in the step (3), wherein the capacity threshold where the lithium battery fails is 65%-75% of a nominal capacity of the lithium battery.

5. The method, as recited in claim 1, wherein the step (5) specifically comprises steps of: continually predicting a capacity of the lithium battery of each of the charge-discharge cycles after $T_n$, finding out a first charge-discharge cycle $T_{n+g}$ satisfying $H_{n+g} \geq H_{threshold}$ and $H_{n+g+1} < H_{threshold}$, wherein the capacity data of the lithium battery are $H_1, H_2, \ldots, H_n$, where $n \geq 1$, and n is a cycle number measured; the capacity data series of the lithium battery is $[H_1, H_2, \ldots, H_n]$; the charge-discharge cycles of the capacity data of the lithium battery are $T_1, T_2, \ldots, T_n$, and the charge-discharge cycle data series is $[T_1, T_2, \ldots, T_n]$; the lithium battery fails after the first charge-discharge cycle $T_{n+g}$, and the remaining useful life is g charge-discharge cycles; $H_{threshold}$ is the capacity threshold where the lithium battery fails, which is 65%-75% of a nominal capacity of the lithium battery.

* * * * *